(12) United States Patent
DeBoer et al.

(10) Patent No.: US 7,045,277 B2
(45) Date of Patent: May 16, 2006

(54) SEMICONDUCTOR PROCESSING METHODS OF TRANSFERRING PATTERNS FROM PATTERNED PHOTORESISTS TO MATERIALS, AND STRUCTURES COMPRISING SILICON NITRIDE

(75) Inventors: Scott Jeffrey DeBoer, Boise, ID (US); John T. Moore, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 156 days.

(21) Appl. No.: 10/160,698

(22) Filed: May 30, 2002

(65) Prior Publication Data

US 2002/0151191 A1 Oct. 17, 2002

Related U.S. Application Data

(62) Division of application No. 09/488,947, filed on Jan. 18, 2000, now Pat. No. 6,440,860.

(51) Int. Cl.
*G03F 7/26* (2006.01)
*H01L 21/027* (2006.01)

(52) U.S. Cl. .................. 430/313; 430/317; 438/257; 438/942

(58) Field of Classification Search ............ 430/311, 430/312, 313, 317; 438/253, 257, 689, 942, 438/948
See application file for complete search history.

(56) References Cited

U.S. PATENT DOCUMENTS

| | | | |
|---|---|---|---|
| 4,158,717 A | 6/1979 | Nelson | |
| 4,444,617 A | 4/1984 | Whitcomb | |
| 4,474,975 A | 10/1984 | Clemons et al. | |
| 4,523,214 A | 6/1985 | Hirose et al. | 257/443 |
| 4,552,783 A | 11/1985 | Stoll et al. | 427/91 |

(Continued)

FOREIGN PATENT DOCUMENTS

| | | |
|---|---|---|
| EP | 0 471 185 A2 | 7/1991 |
| EP | 0 464 515 A3 B1 | 8/1992 |
| EP | 0 588 087 A2 | 8/1993 |

(Continued)

OTHER PUBLICATIONS

TEXT: Jenkins, F. et al., "Fundamentals of Optics", Properties of Light, pp. 9–10. (No date).
TEXT: Wolf, S. et al., "Silicon Processing for the VLSI Era", vol. 1, pp. 437–441. (No date).
D.R. McKenzie et al., "New Technology for PACVD[1]", Surface and Coatings Technology, 82 (1996), pp. 326–333.
S. McClatchie et al.; "Low Dielectric Constant Flowfill® Technology For IMD Applications"; undated; 7 pages.

(Continued)

*Primary Examiner*—Kathleen Duda
(74) *Attorney, Agent, or Firm*—Wells St. John P.S.

(57) ABSTRACT

The invention includes a semiconductor processing method. A first material comprising silicon and nitrogen is formed. A second material is formed over the first material, and the second material comprises silicon and less nitrogen, by atom percent, than the first material. An imagable material is formed on the second material, and patterned. A pattern is then transferred from the patterned imagable material to the first and second materials. The invention also includes a structure comprising a first layer of silicon nitride over a substrate, and a second layer on the first layer. The second layer comprises silicon and is free of nitrogen. The structure further comprises a third layer consisting essentially of imagable material on the second layer.

5 Claims, 5 Drawing Sheets

U.S. PATENT DOCUMENTS

| | | |
|---|---|---|
| 4,562,091 A | 12/1985 | Sachdev et al. ............... 427/41 |
| 4,592,129 A | 6/1986 | Legge ........................ 438/72 |
| 4,600,671 A | 7/1986 | Saitoh et al. |
| 4,648,904 A | 3/1987 | Depasquale et al. |
| 4,695,859 A | 9/1987 | Guha et al. |
| 4,702,936 A | 10/1987 | Maeda et al. |
| 4,755,478 A | 7/1988 | Abernathey et al. .......... 437/41 |
| 4,764,247 A | 8/1988 | Leveriza et al. ............ 156/643 |
| 4,805,683 A | 2/1989 | Magdo et al. |
| 4,833,096 A | 5/1989 | Huang et al. |
| 4,863,755 A | 9/1989 | Hess et al. |
| 4,870,470 A | 9/1989 | Bass, Jr. et al. ........... 357/23.5 |
| 4,910,160 A | 3/1990 | Jennings et al. ............. 437/31 |
| 4,940,509 A | 7/1990 | Tso et al. ................... 156/653 |
| 4,954,867 A | 9/1990 | Hosaka |
| 4,971,655 A | 11/1990 | Stefano et al. |
| 4,992,306 A | 2/1991 | Hochberg et al. |
| 5,034,348 A | 7/1991 | Hartswick et al. |
| 5,036,383 A | 7/1991 | Mori |
| 5,061,509 A | 10/1991 | Naito et al. |
| 5,140,390 A | 8/1992 | Li et al. |
| 5,219,613 A | 6/1993 | Fabry et al. |
| 5,234,869 A | 8/1993 | Mikata et al. |
| 5,244,537 A | 9/1993 | Ohnstein .................... 156/643 |
| 5,260,600 A | 11/1993 | Harada |
| 5,270,267 A | 12/1993 | Ouellet |
| 5,286,661 A | 2/1994 | de Fresart et al. |
| 5,302,366 A | 4/1994 | Schuette et al. |
| 5,312,768 A | 5/1994 | Gonzalez .................... 437/40 |
| 5,314,724 A | 5/1994 | Tsukune et al. |
| 5,340,621 A | 8/1994 | Matsumoto et al. |
| 5,356,515 A | 10/1994 | Tahara et al. |
| 5,376,591 A | 12/1994 | Maeda et al. |
| 5,405,489 A | 4/1995 | Kim et al. |
| 5,413,963 A | 5/1995 | Yen et al. ................... 437/195 |
| 5,429,987 A | 7/1995 | Allen ........................ 437/187 |
| 5,439,838 A | 8/1995 | Yang ......................... 437/43 |
| 5,441,797 A | 8/1995 | Hogan et al. |
| 5,461,003 A | 10/1995 | Havemann et al. |
| 5,470,772 A | 11/1995 | Woo |
| 5,472,827 A | 12/1995 | Ogawa et al. |
| 5,472,829 A | 12/1995 | Ogawa |
| 5,482,894 A | 1/1996 | Havemann .................. 437/195 |
| 5,498,555 A | 3/1996 | Lin .......................... 438/302 |
| 5,536,857 A | 7/1996 | Narula et al. |
| 5,541,445 A | 7/1996 | Quellet |
| 5,543,654 A | 8/1996 | Dennen |
| 5,554,567 A | 9/1996 | Wang |
| 5,591,494 A | 1/1997 | Sato et al. |
| 5,591,566 A | 1/1997 | Ogawa |
| 5,593,741 A | 1/1997 | Ikeda |
| 5,600,165 A | 2/1997 | Tsukamoto et al. |
| 5,639,687 A | 6/1997 | Roman et al. ................ 438/69 |
| 5,641,607 A | 6/1997 | Ogawa et al. |
| 5,648,202 A | 7/1997 | Ogawa et al. |
| 5,652,187 A | 7/1997 | Kim et al. |
| 5,656,330 A | 8/1997 | Niiyama et al. |
| 5,656,337 A | 8/1997 | Park et al. |
| 5,661,093 A | 8/1997 | Ravi et al. |
| 5,667,015 A | 9/1997 | Harestad et al. |
| 5,670,297 A | 9/1997 | Ogawa et al. |
| 5,674,356 A | 10/1997 | Nagayama |
| 5,677,015 A | 10/1997 | Hasegawa |
| 5,677,111 A | 10/1997 | Ogawa |
| 5,691,212 A | 11/1997 | Tsai et al. |
| 5,698,352 A | 12/1997 | Ogawa et al. |
| 5,709,741 A | 1/1998 | Akamatsu et al. |
| 5,710,067 A | 1/1998 | Foote et al. |
| 5,711,987 A | 1/1998 | Bearinger et al. ............ 427/7 |
| 5,731,242 A | 3/1998 | Parat et al. |
| 5,741,721 A | 4/1998 | Stevens |
| 5,744,399 A | 4/1998 | Rostoker et al. |
| 5,747,388 A | 5/1998 | Kusters et al. ............... 438/723 |
| 5,750,442 A | 5/1998 | Juengling |
| 5,753,320 A | 5/1998 | Mikoshiba et al. |
| 5,759,755 A | 6/1998 | Park et al. |
| 5,783,493 A | 7/1998 | Yeh et al. |
| 5,786,039 A | 7/1998 | Brouquet |
| 5,792,689 A | 8/1998 | Yang et al. |
| 5,800,877 A | 9/1998 | Maeda et al. |
| 5,801,399 A | 9/1998 | Hattori et al. |
| 5,807,660 A | 9/1998 | Lin et al. |
| 5,817,549 A | 10/1998 | Yamazaki et al. |
| 5,831,321 A | 11/1998 | Nagayama |
| 5,838,052 A | 11/1998 | McTeer |
| 5,840,610 A | 11/1998 | Gilmer et al. ............... 438/301 |
| 5,858,880 A | 1/1999 | Dobson et al. |
| 5,872,035 A | 2/1999 | Kim et al. |
| 5,872,385 A | 2/1999 | Taft et al. |
| 5,874,367 A | 2/1999 | Dobson |
| 5,883,011 A | 3/1999 | Lin et al. |
| 5,883,014 A | 3/1999 | Chen et al. |
| 5,933,721 A | 8/1999 | Hause et al. |
| 5,948,482 A | 9/1999 | Brinker et al. |
| 5,960,289 A | 9/1999 | Tsui et al. |
| 5,962,581 A | 10/1999 | Hayase et al. |
| 5,968,324 A | 10/1999 | Cheung et al. |
| 5,968,611 A | 10/1999 | Kaloyeros et al. |
| 5,981,368 A | 11/1999 | Gardner et al. |
| 5,985,519 A | 11/1999 | Kakamu et al. ............. 430/313 |
| 5,986,318 A | 11/1999 | Kim et al. ................... 257/437 |
| 5,994,217 A | 11/1999 | Ng ........................... 438/636 |
| 5,994,730 A | 11/1999 | Shrivastava et al. |
| 6,001,741 A | 12/1999 | Alers |
| 6,001,747 A | 12/1999 | Annapragada ............... 438/790 |
| 6,004,850 A | 12/1999 | Lucas et al. |
| 6,008,121 A | 12/1999 | Yang et al. |
| 6,008,124 A | 12/1999 | Sekiguchi et al. |
| 6,017,614 A | 1/2000 | Tsai et al. ................... 428/209 |
| 6,017,779 A | 1/2000 | Miyasaka |
| 6,020,243 A | 2/2000 | Wallace et al. |
| 6,022,404 A | 2/2000 | Ettlinger et al. |
| 6,028,015 A | 2/2000 | Wang et al. |
| 6,030,901 A | 2/2000 | Hopper et al. ............... 438/711 |
| 6,040,619 A | 3/2000 | Wang et al. |
| 6,054,379 A | 4/2000 | Yau et al. |
| 6,057,217 A | 5/2000 | Uwasawa .................... 438/585 |
| 6,060,765 A | 5/2000 | Maeda |
| 6,060,766 A | 5/2000 | Mehta et al. |
| 6,071,799 A | 6/2000 | Park et al. |
| 6,072,227 A | 6/2000 | Yau et al. |
| 6,087,064 A | 7/2000 | Lin et al. .................. 430/270.1 |
| 6,087,267 A | 7/2000 | Dockrey et al. |
| 6,096,656 A | 8/2000 | Matzke et al. ............... 438/702 |
| 6,114,255 A | 9/2000 | Juengling |
| 6,121,133 A | 9/2000 | Iyer et al. ................... 438/636 |
| 6,124,641 A | 9/2000 | Matsuura |
| 6,130,168 A | 10/2000 | Chu et al. |
| 6,133,096 A | 10/2000 | Su et al. |
| 6,133,613 A | 10/2000 | Yao et al. |
| 6,133,618 A | 10/2000 | Steiner ...................... 257/646 |
| 6,136,636 A | 10/2000 | Wu |
| 6,140,151 A | 10/2000 | Akram |
| 6,140,677 A | 10/2000 | Gardner et al. |
| 6,143,670 A | 11/2000 | Cheng et al. ............... 438/780 |
| 6,153,504 A | 11/2000 | Shields et al. |
| 6,156,674 A | 12/2000 | Li et al. |
| 6,159,804 A | 12/2000 | Gardner et al. |
| 6,159,871 A | 12/2000 | Loboda et al. |
| 6,184,151 B1 | 2/2001 | Adair et al. |
| 6,184,158 B1 | 2/2001 | Shufflebotham et al. .... 438/788 |

| | | |
|---|---|---|
| 6,187,657 B1 | 2/2001 | Xiang et al. |
| 6,187,694 B1 | 2/2001 | Cheng et al. |
| 6,198,144 B1 | 3/2001 | Pan et al. |
| 6,200,835 B1 | 3/2001 | Manning ............... 438/158 |
| 6,200,863 B1 | 3/2001 | Xiang et al. ............ 438/286 |
| 6,204,168 B1 | 3/2001 | Naik et al. ............... 438/638 |
| 6,209,484 B1 | 4/2001 | Huang et al. ........... 118/723 E |
| 6,218,292 B1 | 4/2001 | Foote ...................... 438/636 |
| 6,225,217 B1 | 5/2001 | Usami et al. |
| 6,235,568 B1 | 5/2001 | Murthy et al. |
| 6,235,591 B1 | 5/2001 | Balasubramanian et al. |
| 6,238,976 B1 | 5/2001 | Noble et al. |
| 6,268,282 B1 | 7/2001 | Sandhu et al. |
| 6,274,292 B1 | 8/2001 | Holscher et al. |
| 6,281,100 B1 | 8/2001 | Yin et al. |
| 6,284,677 B1 | 9/2001 | Hsiao et al. ............. 438/783 |
| 6,323,101 B1 | 11/2001 | Li et al. |
| 6,348,407 B1 | 2/2002 | Gupta et al. ............. 438/637 |
| 6,373,114 B1 | 4/2002 | Jeng et al. ................ 257/413 |
| 6,403,464 B1 | 6/2002 | Chang ..................... 438/623 |
| 6,429,115 B1 | 8/2002 | Tsai et al. ................. 438/622 |
| 6,432,791 B1 | 8/2002 | Hutter et al. ............. 438/381 |
| 6,435,943 B1 | 8/2002 | Chang et al. ............. 451/28 |
| 6,436,808 B1 | 8/2002 | Ngo et al. ................ 438/623 |
| 6,440,860 B1 * | 8/2002 | DeBoer et al. ........... 438/703 |
| 6,444,593 B1 | 9/2002 | Ngo et al. ................ 438/788 |
| 6,465,372 B1 | 10/2002 | Xia et al. ................. 438/787 |
| 6,486,057 B1 | 11/2002 | Yeh et al. ................. 438/633 |
| 6,486,061 B1 | 11/2002 | Xia et al. ................. 438/680 |
| 6,492,688 B1 | 12/2002 | Ilg ........................... 257/369 |
| 6,498,084 B1 | 12/2002 | Bergemont |
| 6,503,818 B1 | 1/2003 | Jang ......................... 438/584 |
| 6,518,122 B1 | 2/2003 | Chan et al. ............... 438/257 |
| 6,627,535 B1 | 9/2003 | MacNeil et al. |
| 6,632,712 B1 | 10/2003 | Ang et al. ................ 438/212 |
| 6,638,875 B1 | 10/2003 | Han et al. |
| 6,720,247 B1 | 4/2004 | Kirkpatrick et al. |
| 6,723,631 B1 | 4/2004 | Noguchi et al. |
| 6,790,778 B1 | 9/2004 | Cheng et al. ............. 438/687 |
| 2001/0003064 A1 | 6/2001 | Ohto ......................... 438/637 |
| 2001/0019868 A1 | 9/2001 | Gonzalez et al. ........... 438/275 |
| 2001/0038919 A1 | 11/2001 | Berry, III et al. ........... 428/446 |
| 2002/0016085 A1 | 2/2002 | Huang et al. ............. 438/798 |
| 2002/0033486 A1 | 3/2002 | Kim et al. ................. 257/118 |
| 2002/0081834 A1 | 6/2002 | Daniels et al. ............. 438/624 |
| 2003/0013311 A1 | 1/2003 | Chang et al. ............. 438/704 |
| 2003/0077916 A1 | 4/2003 | Xu et al. |
| 2003/0164354 A1 | 9/2003 | Hsieh et al. ............... 216/22 |
| 2003/0173671 A1 | 9/2003 | Hironaga et al. .......... 257/758 |
| 2003/0207594 A1 | 11/2003 | Catabay et al. |
| 2004/0071878 A1 | 4/2004 | Schuhmacher et al. |
| 2004/0126671 A1 | 7/2004 | Smith et al. .................. 430/5 |
| 2004/0175933 A1 | 9/2004 | Shisida et al. ............. 438/637 |
| 2005/0023691 A1 | 2/2005 | Watanabe et al. .......... 257/758 |

FOREIGN PATENT DOCUMENTS

| | | |
|---|---|---|
| EP | 0 588 087 A3 | 8/1993 |
| EP | 0 778 496 A2 | 5/1996 |
| EP | 0 771 886 A1 | 7/1997 |
| EP | 0 942330 | 9/1999 |
| EP | 1172845 A2 | 1/2002 |
| GB | 593727 | 10/1947 |
| JP | 63-157443 | 6/1988 |
| JP | 63316476 | 12/1988 |
| JP | 5-263255 | 10/1993 |
| JP | 6232113 | 8/1994 |
| JP | 406244172 A | 9/1994 |
| JP | 07201716 A | 8/1995 |
| JP | 7201716 | 8/1995 |
| JP | 08-045926 A | 2/1996 |
| JP | 08046186 A | 2/1996 |
| JP | 8046186 | 2/1996 |
| JP | 8046188 | 2/1996 |
| JP | 8051058 | 2/1996 |
| JP | 8078322 | 3/1996 |
| JP | 08-213386 A | 8/1996 |
| JP | 09-050993 | 2/1997 |
| JP | 09055351 | 2/1997 |
| JP | 10-163083 | 6/1998 |
| JP | 06067019 A | 9/1999 |
| JP | 200068261 A | 3/2000 |
| TW | 368687 A | 9/1999 |
| TW | 420844 A | 2/2001 |
| TW | 429473 A | 4/2001 |
| TW | 47112 A | 1/2002 |

OTHER PUBLICATIONS

K. Beekmann et al.; "Sub–micron Gap Fill and In–Situ Planarisation using Flowfill$^{SM}$ Technology"; Oct. 1995; pp. 1–7.

A. Kiermasz et al.; "Planarisation for Sub–Micron Devices Utilising a New Chemistry"; Electrotech, Feb. 1995; 2 pages.

IBM Technical Disclosure Bulletin "Low–Temperature Deposition of SiO2, SiO2–Si3N4," vol. 28, No. 9, p. 4170, Feb. 1986.

ARTICLE: Bencher, C. et al., "Dieletric antireflective coatings for DUV lithography", Solid State Techonolgy (Mar. 1997), pp. 109–114.

Noboru Shibata, "Plasma–Chemical Vapor–Deposited Silicon Oxide Silicon Oxynitride Double–Layer Antireflective Coating for Solar Cells", Japanese Journal of Applied Physics, vol. 30, No. 5, May 1991, pp 997–1001.

Ralls, Kenneth M., "Introduction to Materials Science and Engineering", John Wiley & Sons. © 1976, pp. 312–313.

Ravi K. Laxman, "Synthesizing Low–k CVD Materials for Fab Use", Semiconductor International, Nov. 2000, 10 pps.

Anonymous, New gas helps make faster IC's, Machine Design Cleveland, © Penton Media, Inc., Nov. 4, 1999, pp. 118.

Lobada et al, "Using Trimethylsilane to Improve Safety Throughput and Versatility in PECVD Processes", 4th International Symposium on Silicon Nitride and Silicon Dioxide This Insulating Films, The Electrochemical Society, Abstract No. 358, p. 454, May 1997.

ARTICLE: Dammel, R. R. et al., "Dependence of Optical Constants of AZ® BARLi™ Bottom Coating on Back Conditions", SPIE vol. 3049 (1997), pp. 963–973.

TEXT: Heavens, O. S., "Optical Properties of Thin Solid Films", pp. 48–49, no date.

Withmall, R. et al., "Matrix Reactions of Methyisilanes and Oxygen Atoms", Phys. Chem 1988, pp. 594–602.

Weidman, T. et al., "New photodefinable glass etch masks for entirely dry photolithography: Plasma deposited orarganosilicon hydride polymers", Appl. Phys. Lett Jan. 25, 1993, pp. 372–374.

Weidman, et al., "All Dry Lithography: Applications of Plasma Polymerized Methylsilane as a Single Layer Resist and Silicon Dioxide Precursor", Journal of Photopolymer Science and Technology, V. 8, #4, 1995, pp. 679–686.

Joubert et al., "Application of Plasma Polymerized Methylsilane in an all dry resist process for 193 and 248 nm Lithography", Microelectronic Engineering 30 (1996), pp. 275–278.

Joshi, A.M. et al., Plasma Deposited Organosilicon Hydride Network Polymers as Versatile Resists for Entirely Dry Mid–Deep UV Photolithography, SPIE vol. 1925, pp 709–720.

Matsuura, M. et al., "Highly Reliable Self–Planarizing Low–k Intermetal Dielectric for Sub–quarter Micron Interconnects", IEEE 1997, pp. 785–788.

Horie, O. et al., Kinetics and Mechanism of the Reactions of . . . , J. Phys. Chem 1991, 4393–4400.

Stanley Wolf, Silicon Processing for the VLSI Era, vol. 3, Lattice Press 1995, p. 635.

Wolf, S. "Silicon Processing for the VLSI Era," vol. 1, pps. 407–413, 1990.

Wolf, S. "Silicon Processing for the VLSI Era", vol. 2, pp. 48–49 and 435, 1990.

Hack's Chemical Dictionary, 1969, p. 27.

S. Wolf and R.N. Tauber, Silicon Processing for the VLSI Era (vol. 1–Process Technology), pp. 189–190, 1986.

Wolf, S., Silicon Process for the VLSI Era, V.1—Process Technology, Prologue, p. xxiii, Fig. 3, no date.

Wolf et al., Silicon Processing for the VLSI Era, 1986, Lattice Press, vol. 1, pp. 1 and 2.

* cited by examiner

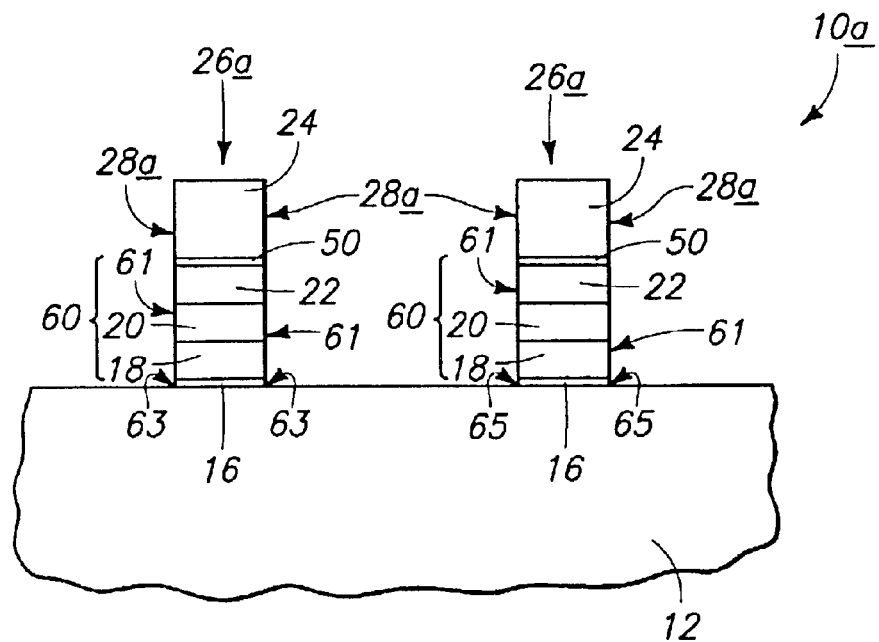
F I G 7
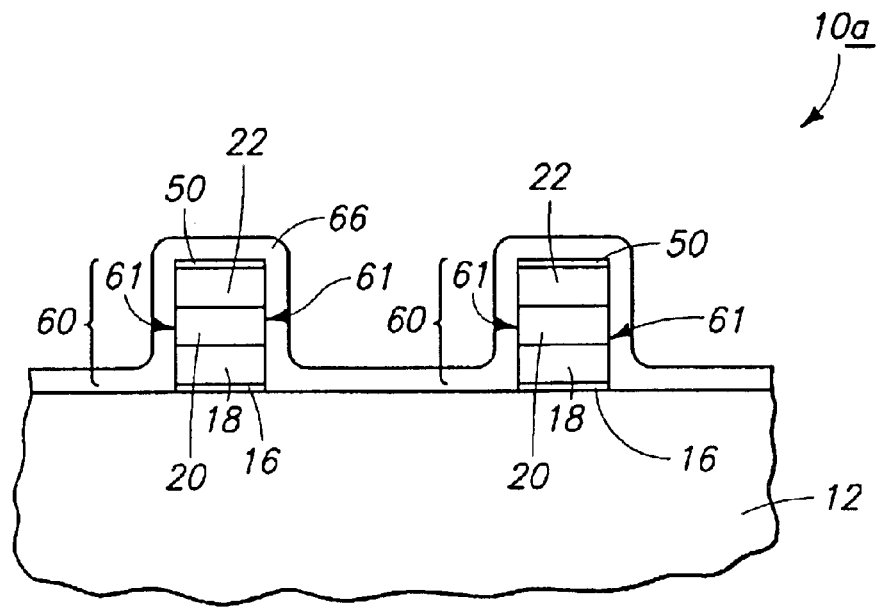
F I G 8

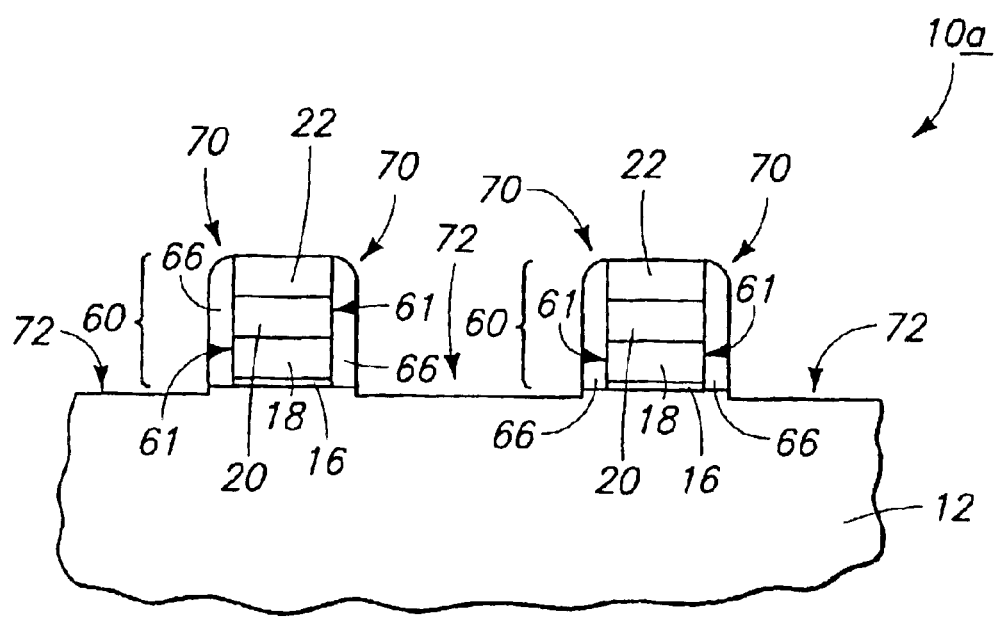
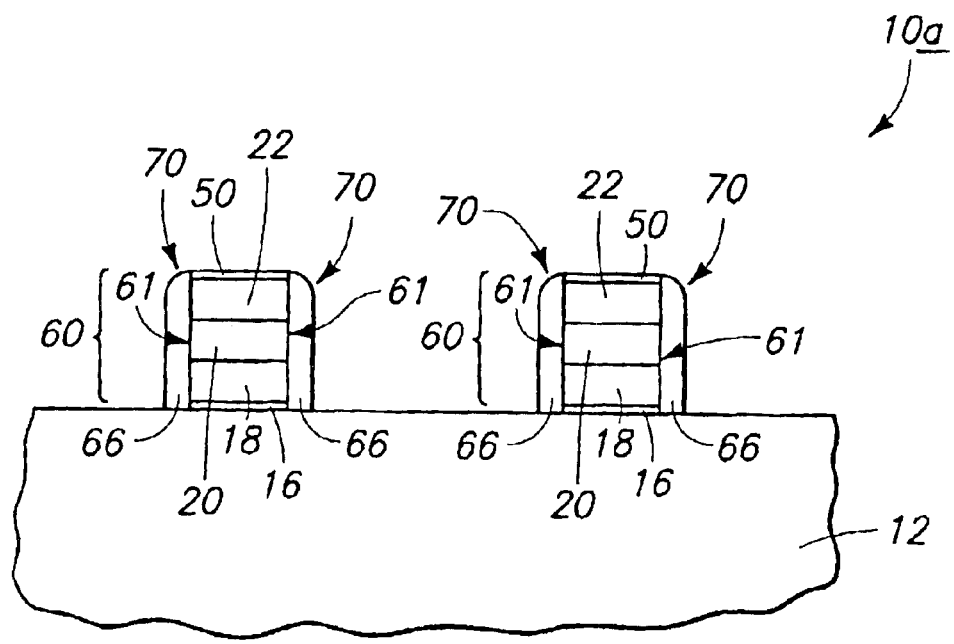

SEMICONDUCTOR PROCESSING METHODS OF TRANSFERRING PATTERNS FROM PATTERNED PHOTORESISTS TO MATERIALS, AND STRUCTURES COMPRISING SILICON NITRIDE

CROSS REFERENCE TO RELATED APPLICATION

This application is a divisional of U.S. patent application Ser. No. 09/488,947 which was filed on Jan. 18, 2000 now U.S. Pat. No. 6,440,860, and which is incorporated by reference herein.

TECHNICAL FIELD

The invention pertains to methods of transferring patterns from photoresists to materials, and also pertains to structures comprising silicon nitride.

BACKGROUND OF THE INVENTION

A commonly utilized process for patterning structures utilized for integrated circuitry is photolithographic processing. An imagable material (typically photoresist) is provided over a mass which is ultimately to be patterned. Portions of the imagable material are then exposed to radiation, while other portions remain unexposed (in the case of photoresist, the radiation is light). After the exposure, the material is subjected to conditions which selectively remove either the portions of the exposed to radiation, or the portions which were not exposed to radiation. If the imagable material comprises photoresist and the portions exposed to radiation are removed, the photoresist is referred to as a positive photoresist, whereas if the portions which are not exposed to radiation are removed the photoresist is referred to as a negative photoresist. Once the imagable material is patterned, it is utilized as a masking layer for patterning the underlying mass. Specifically, the patterned imagable material covers some portions of the mass, while leaving other portions exposed to an etch which removes the exposed portions. Accordingly, the mass remaining after the etch is in approximately the same pattern as the patterned imagable material formed over the mass.

Photolithographic processing is utilized for patterning numerous materials, including silicon nitride. However, problems can occur during the utilization of photolithographic processing for patterning silicon nitride. Specifically, the pattern formed in silicon nitride is frequently not the same as the pattern which was intended to be formed in the photoresist. Such problem can be particularly severe when utilizing photoresist patterned with deep UV light processing, wherein deep UV light is defined as ultraviolet light having a wavelength of less than or equal to 248 nanometers. It would be desirable to develop methods for avoiding the above-discussed problems.

SUMMARY OF THE INVENTION

In one aspect, the invention includes a semiconductor processing method. A first material comprising silicon and nitrogen is formed. A second material is formed over the first material, and the second material comprises silicon and less nitrogen (by atom percent) than the first material. An imagable material is formed on the second material, and patterned. A pattern is then transferred from the patterned imagable material to the first and second materials.

In another aspect, the invention encompasses a method of forming a patterned structure. A first layer comprising silicon and nitrogen is formed over a substrate. A sacrificial layer is formed on the first layer, and comprises less nitrogen (by atom percent) than the first layer. A layer of imagable material is formed on the sacrificial layer and patterned. The patterned structure has a pair of opposing sidewalls extending upwardly from the substrate. A pair of opposing corners are defined where the sidewalls join the substrate. The opposing corners are closer to one another than they would be if the sacrificial layer was absent and the imagable material was on the first layer during the patterning of the imagable material. The sacrificial layer is removed from the patterned structure.

In yet another aspect, the invention encompasses a structure comprising a first layer of silicon nitride over a substrate, and a second layer on the first layer. The second layer comprises silicon and is free of nitrogen. The structure further comprises a third layer consisting essentially of imagable material on the second layer.

BRIEF DESCRIPTION OF THE DRAWINGS

Preferred embodiments of the invention are described below with reference to the following accompanying drawings.

FIG. 7 is a view of the FIG. 4 fragment shown at a processing step subsequent to that of FIG. 6.

FIG. 8 is a view of the FIG. 4 fragment shown at a processing step subsequent to that of FIG. 7.

FIG. 9 is a view of the FIG. 4 fragment shown at a processing step subsequent to that of FIG. 8 in accordance with an embodiment of the present invention.

FIG. 10 is a view of the FIG. 4 fragment shown at a processing step subsequent to that of FIG. 8 in accordance with another embodiment of the present invention.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
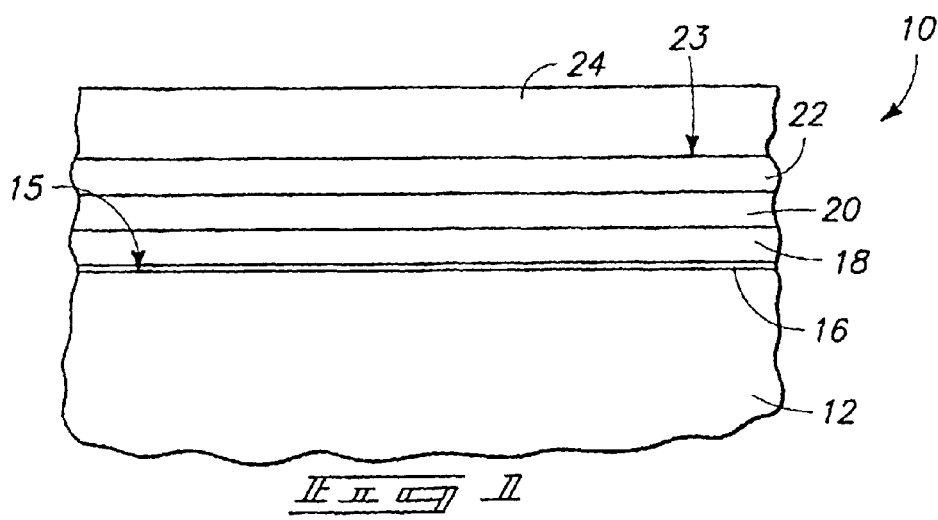
FIG. 1 is a fragmentary, diagrammatic, cross-sectional view of a semiconductor wafer fragment.

A method of utilizing photoresist for patterning a silicon nitride material is described with reference to FIGS. 1–3. Referring to FIG. 1, a semiconductor wafer fragment 10 is illustrated at a preliminary step of the method. Fragment 10 comprises a substrate 12 having an upper surface 15. Substrate 12 can comprise, for example, monocrystalline silicon. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Layers 16, 18, 20, 22 and 24 are formed over upper surface 15, and are ultimately to be patterned into a wordline. Accordingly, layer 16 comprises silicon dioxide, layer 18 comprises conductively doped silicon (i.e., silicon doped to a concentration of at least about $10^{18}$ atoms/cm$^3$ with a conductivity enhancing dopant), layer 20 comprises a metal (such as, for example, tungsten or titanium), and layer 22 comprises silicon nitride. Layer 22 has an upper surface 23, and layer 24 is formed on (i.e., against) such upper surface. Layer 24 comprises an imagable material, and is described herein to comprise photoresist. It is to be understood, however, that the term "imagable material" can encompasses materials patterned by radiation (or energy) other than light, and can accordingly encompass materials other than photoresist.

Figure 2:
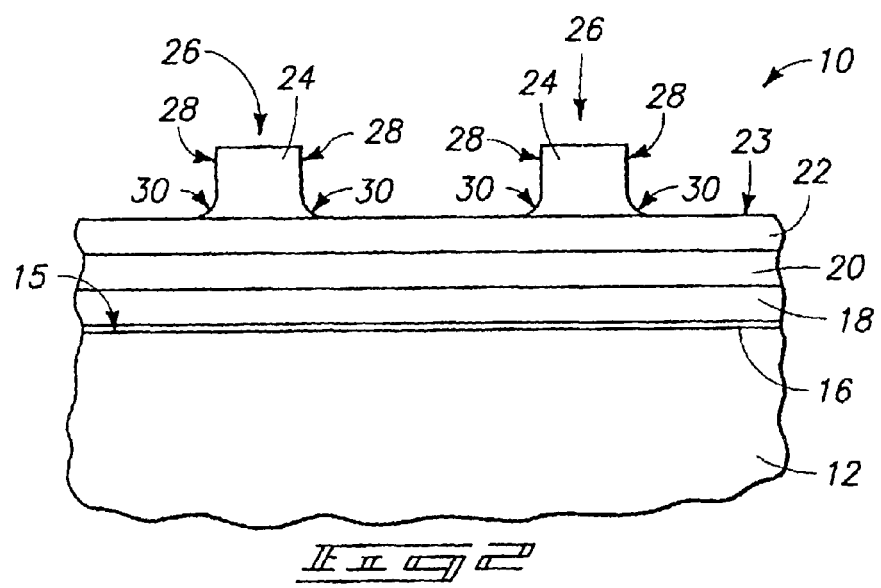
FIG. 2 is a view of the FIG. 1 fragment shown at a processing step subsequent to that of FIG. 1.

Referring to FIG. 2, photoresist 24 is patterned to form blocks 26. Such patterning can comprise, for example, exposing portions of the photoresist to radiation while leaving other portions unexposed, and subsequently selectively removing either the exposed or unexposed portions with a solvent.

Blocks 26 comprise sidewalls 28 which are preferably substantially perpendicular to upper surface 23 of silicon nitride layer 22. However, a problem which occurs during the patterning of photoresist 24 is that photoresist adjacent blocks 26 does not remove as well as photoresist which is further removed from blocks 26. Such results in the formation of foot portions 30 at locations where sidewalls 28 join upper surface 23 of silicon nitride layer 22.

Figure 3:
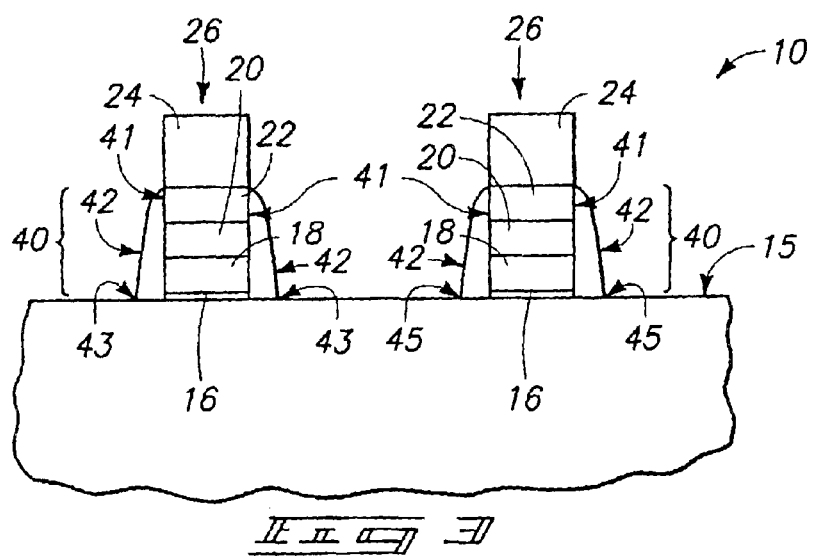
FIG. 3 is a view of the FIG. 1 fragment shown at a processing step subsequent to that of FIG. 2.

Referring to FIG. 3, blocks 26 are utilized as a mask during an etch of underlying layers 16, 18, 20 and 22 to form wordline stacks 40 from layers 16, 18, 20 and 22. Wordline stacks 40 comprise sidewalls 41 which are substantially perpendicular to upper surface 15 of substrate 12.

As shown, foot portions 30 (FIG. 2) are variably eroded during formation of wordline stacks 40 so that the stacks have laterally extending portions 42 where the stacks join with substrate 12. Foot portions 30 cause laterally extending portions 42 because the photoresist of foot portions 30 is etched by the conditions which etch layers 16, 18, 20 and 22, and is ultimately removed to allow portions of layers 16, 18, 20 and 22 beneath foot regions 30 to be removed. However, the portions of layers 16, 18, 20 and 22 beneath foot regions 30 are exposed to etching conditions for less time than are portions of layers 16, 18, 20 and 22 that are not beneath foot portions 30. Accordingly, the portions beneath foot portions 30 are etched less than are portions of layers 16, 18, 20 and 22 not beneath foot portions 30, causing formation of laterally extending portions 42. The laterally extending portions 42 extend into a gap between adjacent wordline stacks 40, and thus can affect a critical dimension of a structure (such as a conductive plug or capacitor) subsequently formed between stacks 40.

Sidewalls 41 join upper surface 15 of substrate 12 at a pair of opposing corners 43 relative to one of stacks 40, and a pair of opposing corners 45 relative to another of stacks 40. In many applications it would be desirable if the opposing corners relative to a particular stack were as close together as possible after the patterning of layers 16, 18, 20 and 22. However, laterally extending portions 42 extend a distance between the opposing corners 43, and likewise extend a distance between opposing corners 45.

An aspect of the present invention is a recognition that foot portions 30 of FIG. 2 are due primarily to the formation of imagable material directly on silicon nitride layer 22, and accordingly can be alleviated (or even eliminated) by forming another material between silicon nitride layer 22 and imagable material 24. An embodiment of the present invention is described with reference to a wafer fragment 10*a* of FIG. 4. In referring to FIG. 4, similar numbering will be used as was used above in describing FIGS. 1–3, with differences indicated by the suffix "a", or by different numerals.

Figure 4:
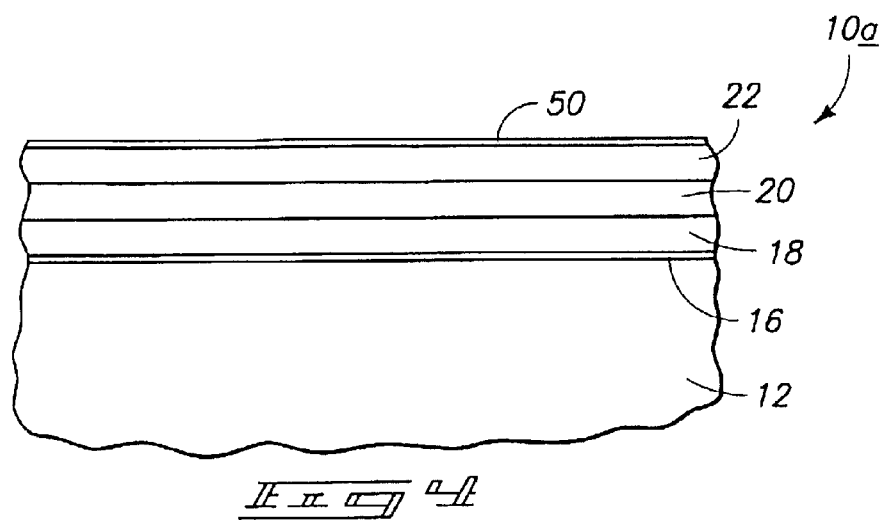
FIG. 4 is a diagrammatic, fragmentary, cross-sectional view of a semiconductor wafer fragment.

Wafer fragment 10*a* of FIG. 4, like wafer fragment 10 of FIG. 1, comprises a substrate 12, a silicon dioxide layer 16, a conductively-doped silicon layer 18, a metal layer 20, and a silicon nitride layer 22. However, fragment 10*a* of FIG. 4 differs from fragment 10 of FIG. 1 in that a imagable-material-supporting mass (or layer) 50 is provided over silicon nitride layer 22. Layer 50 comprises a different material than silicon nitride layer 22. In particular embodiments, layer 50 comprises less nitrogen (by atom percent) than silicon nitride layer 22. For instance, layer 50 can consist essentially of either silicon or conductively doped silicon, and can accordingly be substantially free of nitrogen (with the term "substantially free" understood to mean that layer 50 comprises less than about 10% of the atom percentage of nitrogen of layer 22, and can comprise no nitrogen). Alternatively, layer 50 can consist entirely of silicon or conductively doped silicon, and accordingly be entirely free of nitrogen.

If layer 50 is to comprise, consist of, or consist essentially of either silicon or conductively doped silicon, such layer can be formed by chemical vapor deposition of silicon or polysilicon over layer 22. For instance, the silicon can be deposited utilizing silane, dichlorosilane, or gases of the general formula Si$_x$H$_{(2x+2)}$. Preferably, if layer 50 comprises a conductive material, such layer is formed to be less than 150 Angstroms thick, and more preferably less than 100 Angstroms thick, to enable the layer to be easily removed in subsequent processing. Procedures which can be utilized to form such thin silicon layers are atomic layer deposition (ALD), or low pressure chemical vapor deposition (LPCVD) utilizing a pressure of less than 100 mTorr, at a temperature of less than 550° C. Alternative procedures which could be used for forming thin silicon layers include chemical vapor deposition utilizing a pressure of less than or equal to about 1 Torr, and a temperature of less than or equal to about 650° C.

In an alternative embodiment of the invention, layer 50 can comprise oxygen, and can, for example, comprise, consist of, or consist essentially of silicon dioxide. If layer 50 is to consist of, or consist essentially of silicon dioxide, such layer can be formed by depositing silicon dioxide over layer 22. Alternatively, if layer 50 is to comprise silicon dioxide, such layer can be formed by subjecting an upper surface of layer 22 to oxidizing conditions. The oxidation of silicon nitride layer 22 can comprise, for example, exposing such layer to an oxygen-containing gas, such as, for example, O$_2$, O$_3$, N$_2$O, NO, etc.

If layer 50 is formed by oxidizing an upper portion of silicon nitride layer 22, the resulting structure can be considered to comprise a silicon nitride material which includes both layer 50 and layer 22, with layer 50 being considered an oxidized portion of the silicon nitride material and layer 22 being considered a non-oxidized portion of the material. Further, the oxidized portion defined by layer 50 can be considered to be an oxide cap over the non-oxidized portion.

One method of improving the oxidation of an outer portion of a silicon nitride layer relative to an inner portion is to form the outer portion to have a higher relative concentration of silicon to nitrogen than does the inner portion. A silicon nitride material having a different relative concentration of silicon to nitrogen at one portion than at another portion can be formed by a chemical vapor deposition (CVD) process utilizing a silicon precursor gas (for example, $SiH_2Cl_2$ (dichlorosilane)) and a nitrogen precursor gas (for example, $NH_3$ (ammonia)). In an exemplary process, a substrate is provided within a CVD reaction chamber together with a first ratio of a silicon precursor gas to a nitrogen precursor gas. One portion of silicon nitride layer 22 is then deposited. Subsequently, the ratio of the silicon precursor gas to the nitrogen precursor gas is increased and the other portion of the silicon nitride layer is deposited. Exemplary processing conditions for the CVD process include a pressure of from about 100 mTorr to about 1 Torr, and a temperature of from about 700° C. to about 800° C.

In yet another embodiment, layer 50 can comprise silicon, oxygen, and nitrogen, but comprises less nitrogen (by atom percent) than does layer 22. Layer 50 can be formed by, for example, depositing $Si_xO_yN_z$ utilizing dichlorosilane and $N_2O$, wherein x is greater than 0 and less than 1, y is greater than 0 and less than 1, and z is greater than 0 and less than 1. Alternatively, layer 50 can be formed from bis-(tertiary butyl amino)-silane (BTBAS).

Figure 5:
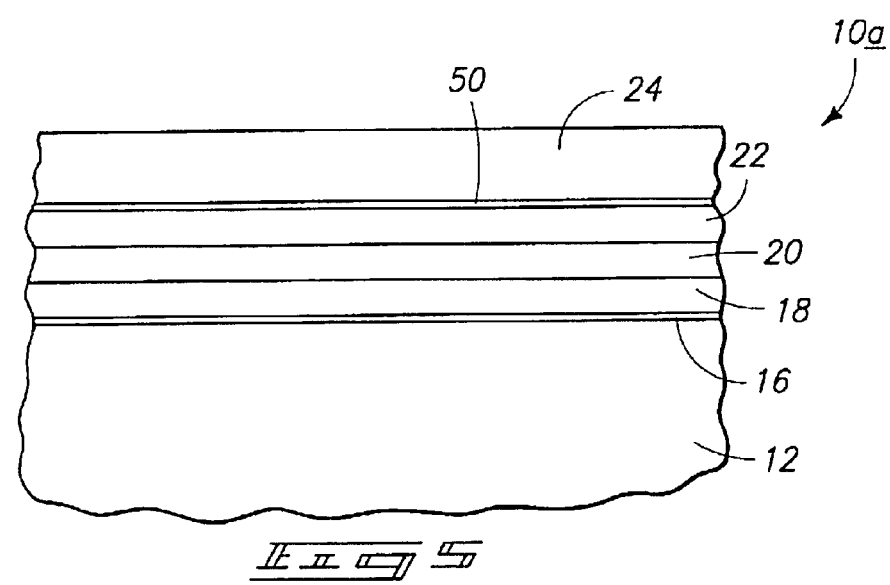
FIG. 5 is a view of the FIG. 4 fragment shown at a processing step subsequent to that of FIG. 4.

Referring to FIG. 5, an imagable material layer 24 is formed over imagable-material-supporting layer 50. Imagable material layer 24 is referred to below as comprising photoresist, but it is to be understood that layer 24 can comprise other imagable materials besides photoresist.

Figure 6:
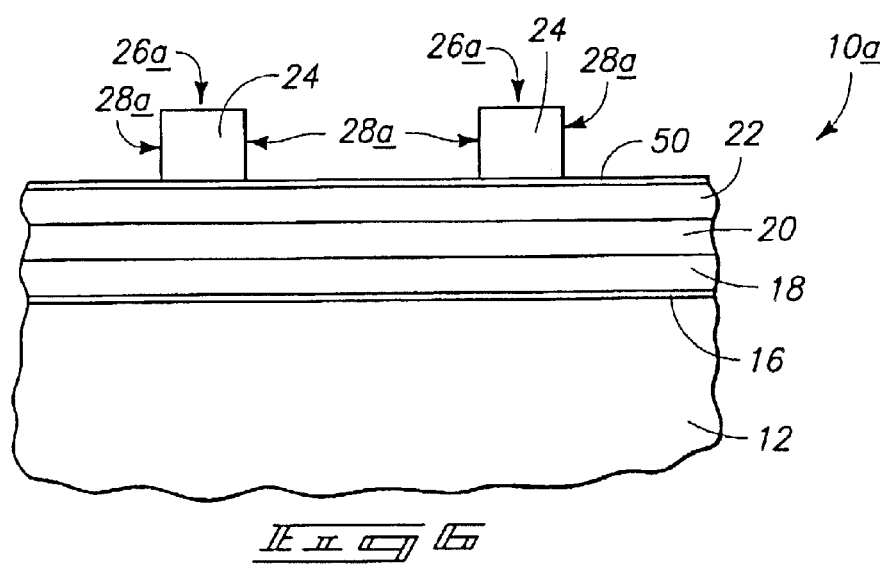
FIG. 6 is a view of the FIG. 4 fragment shown at a processing step subsequent to that of FIG. 5.

Referring to FIG. 6, photoresist 24 is patterned by exposing some portions of resist 24 to radiation while leaving other portions unexposed, and then utilizing a solvent to selectively remove either the exposed or unexposed portions of the photoresist. The patterning forms photoresist 24 into blocks 26a. Blocks 26a comprise sidewalls 28a. Blocks 26a differ from blocks 26 of FIG. 4 in that foot portions 30 (FIG. 4) are missing from blocks 26a. Accordingly, sidewalls 28a of blocks 26a extend substantially perpendicularly from an upper surface of material 50.

Referring to FIG. 7, a pattern is transferred from blocks 26a to underlying materials 16, 18, 20, 22 and 50 to form patterned structures 60 comprising the materials of layers 16, 18, 20, 22 and 50. Patterned structures 60 comprise sidewalls 61 which are coextensive with sidewalls 28a of blocks 26a, and which extend perpendicularly relative to an upper surface of substrate 12. A difference between sidewalls 61 of FIG. 7 and sidewalls 41 of FIG. 3 is that sidewalls 61 lack laterally extending portions (such as the laterally extending portions 42 shown in FIG. 3). Sidewalls 61 join substrate 12 to form opposing corners 63 relative to one of the stacks 60, and opposing corners 65 relative to another of the stacks 60. Opposing corners 63 are closer to one another than opposing corners 43 (FIG. 3), due to the lack of lateral extending portions 42 (FIG. 3) in the FIG. 7 structure. Likewise, opposing corners 65 are closer to one another than opposing corners 45 (FIG. 3). The structure shown in FIG. 7 can be considered to comprise a first layer 22 of silicon nitride over a substrate 20. Such structure can further comprise a second layer 50 which comprises silicon and is free of nitrogen on first layer 22. Additionally, the structure can comprise a third layer 24 consisting essentially of imagable material on second layer 50. Third layer 24 can be, for example, photoresist, and second layer 50 can consist essentially of silicon, conductively doped silicon, or silicon dioxide.

Referring to FIG. 8, photoresist blocks 26a (FIG. 7) are removed and a material 66 is formed over patterned stacks 60, as well as over substrate 12. Material 66 can comprise, for example, an inorganic and electrically insulative material, such as, for example, silicon dioxide or silicon nitride. Material 66 can be formed by, for example, chemical vapor deposition.

The structure of FIG. 8 can be considered to comprise a layer of silicon nitride 22 over a substrate (with the substrate understood to comprise material 12 and layers 16, 18, and 20). The structure further comprises layer 50 over silicon nitride layer 22, and a layer 66 formed on (i.e., against) layer 50. Layer 66 can consist essentially of inorganic material, such as, for example, silicon nitride, silicon dioxide, or $Si_xO_yN_z$ (wherein x, y and z are greater than 0), and can comprise a different chemical composition than layer 50. In the structure of FIG. 8, layers 22 and 50 are part of a stack 60 comprising a pair of substantially planar opposing sidewalls 61. Further in the structure of FIG. 8, layer 66 is over the stack 60 comprising layers 50 and 22, as well as along sidewalls 61 of the stack.

FIGS. 9 and 10 illustrate alternative processing which can occur relative to the FIG. 8 structure. Referring first to FIG. 9, material 66 is subjected to anisotropic etching conditions which forms material 66 into spacers 70 extending along sidewalls 61 of stack 60. Such anisotropic etching is conducted for a sufficient period of time to entirely remove material 50 (FIG. 8) from over silicon nitride material 22. The processing of FIG. 9 can be preferred in embodiments in which material 50 comprises a conductive material, such as, for example, conductively doped silicon. If material 50 were not removed in such embodiments, it could short conductive components across an upper surface of stacks 60. The processing of FIG. 9 can be easier to utilize if material 50 is kept thin (i.e., less than 150 Angstroms thick, and more preferably less than 100 Angstroms thick), as the material can then be removed with less etching than could a thicker material. It is noted that substrate 12 may be etched during the removal of material 50. Such etching into substrate 12 is shown in FIG. 8 as trenches 72 formed within regions of substrate 12 that are not covered by spacers 70 or stacks 60.

Material 50 can be considered a sacrificial material relative to the method of FIGS. 4–9. Specifically, the material is provided in the processing of FIGS. 4–6 to improve patterning of a photoresist material, and subsequently removed in the processing of FIG. 9.

The processing of FIG. 10 is similar to that of FIG. 9 in that material 66 of FIG. 8 is etched to form spacers 70. However, the processing of FIG. 10 differs from that of FIG. 9 in that material 50 remains after the etch of material 66. The processing of FIG. 10 can be preferred in embodiments in which material 50 consists of an electrically insulative material, such as, for example, silicon dioxide, or undoped silicon. If the processing of FIG. 10 is utilized, and if material 50 comprises an insulative material, there can be less preference to keeping the material to a thickness of less than 150 Angstroms relative to the advantages of keeping material 50 to a thickness below 150 Angstroms if the material is electrically conductive and to be removed by the processing of FIG. 9.

Figure 11:
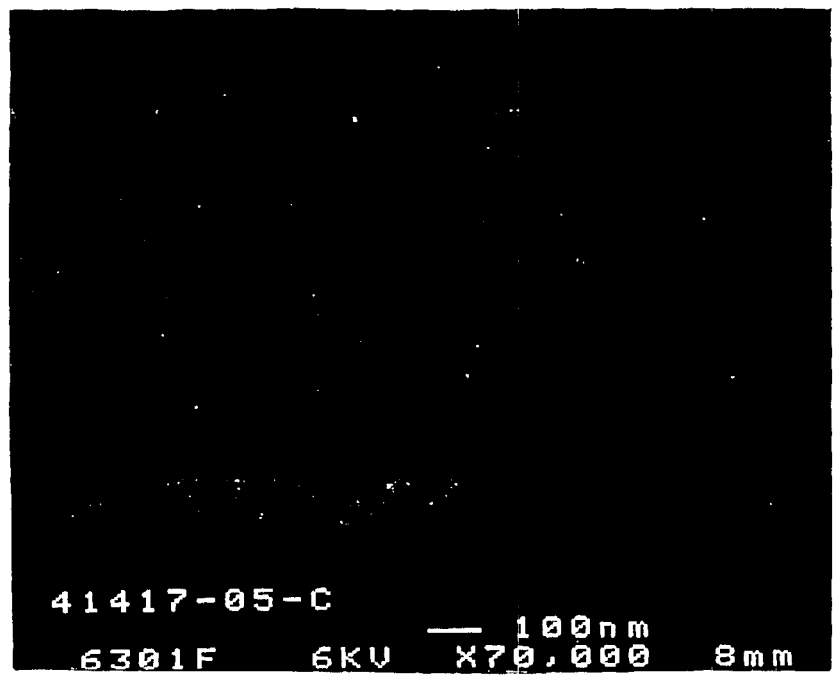
FIG. 11 is a photograph of a semiconductor wafer fragment having structures formed thereover by a particular patterning method.
Figure 12:
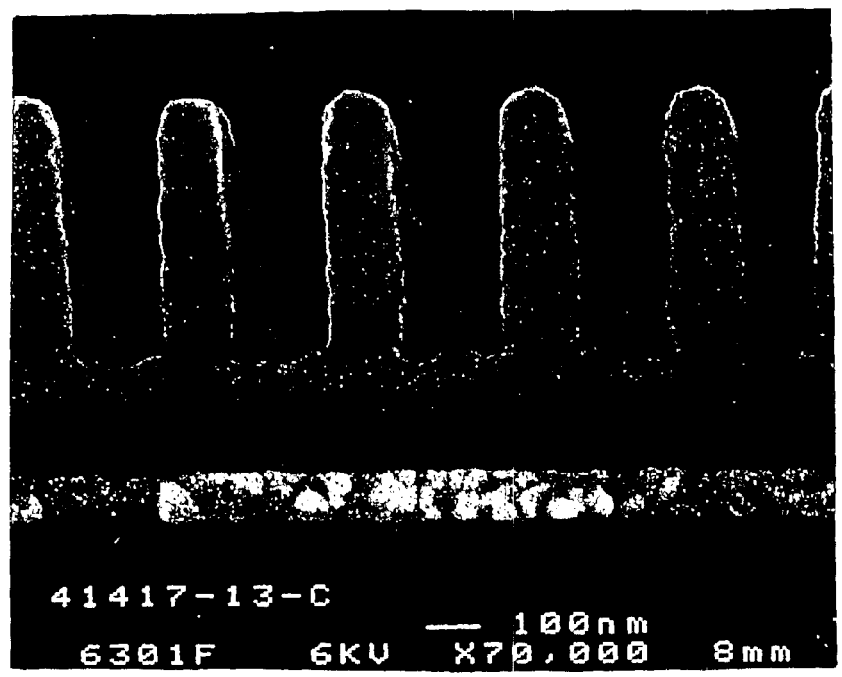
FIG. 12 is a view of a semiconductor wafer fragment having structures formed thereover by a processing method different than that utilized for forming the structures of FIG. 11.

An improvement which can be obtained utilizing photoresist-supporting mask 50 between a layer of photoresist and a layer of silicon nitride during patterning of the photoresist is evidenced by the photographs of FIGS. 11 and 12. Specifically, FIG. 11 shows a structure wherein photoresist is patterned while on silicon nitride, and FIG. 12 shows a structure wherein photoresist is patterned while on a layer of amorphous silicon that is conductively doped to concentration of about $10^{20}$ atoms/cm$^3$ with phosphorus. The structure of FIG. 11 shows photoresist blocks which join an underlying substrate at corners which are less than 90° (and which specifically comprise foot portions at the locations where the sidewalls join the underlying substrate), whereas the structure of FIG. 12 shows photoresist blocks which join an underlying substrate at corners which are about 90°.

EXAMPLES

Example 1

A silicon nitride layer is formed by chemical vapor deposition with dichlorosilane and ammonia at a temperature of from about 600° C. to about 800° C. Subsequently, a layer of silicon is formed on the silicon nitride by chemical vapor deposition utilizing silane at a temperature of from about 500° C. to about 700° C. The silicon can then be utilized to support a layer of photoresist formed over the silicon nitride.

Example 2

A silicon nitride layer is formed by chemical vapor deposition with dichlorosilane and ammonia at a temperature of from about 600° C. to about 800° C. Subsequently, a layer of silicon is formed on the silicon nitride by chemical vapor deposition utilizing silane at a temperature of from about 500° C. to about 700° C. Finally, the silicon is oxidized by exposure to one or more of $N_2O$, NO, $O_2$, $O_3$, at a temperature of from 500° C. to about 800° C. Such forms a layer of silicon dioxide on the silicon nitride. The silicon dioxide can then be utilized to support a layer of photoresist formed over the silicon nitride.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming a patterned structure, comprising:

forming a first layer comprising silicon and nitrogen over a substrate, the first layer having an exposed outer portion;

oxidizing the exposed outer portion of the first layer to form an oxide cap over an underlying non-oxidized portion of the first layer;

forming a layer of imagable material on the oxide cap;

patterning the imagable material;

transferring a pattern from the patterned imagable material to the underlying oxide cap and non-oxidized portion of the first layer removing the imagable material from the oxide cap; and forming an inorganic material layer over the oxide cap, wherein the inorganic material consists essentially of one of silicon nitride, silicon dioxide or $Si_xO_yN_z$, wherein x, y and z are each greater than 0.

2. The method of claim 1 wherein the imagable material is photoresist.

3. The method of claim 1 wherein the exposed outer portion of the first layer comprises a higher relative concentration of silicon to nitrogen than a portion of the first layer under the exposed outer portion.

4. A method of forming a patterned structure, comprising:

forming a first layer comprising silicon and nitrogen over a substrate;

forming a silicon dioxide layer on the first layer;

forming a layer of imagable material on the silicon dioxide layer;

patterning the imagable material;

transferring a pattern from the patterned imagable material to the underlying silicon dioxide layer and first layer;

removing the imagable material from on the silicon dioxide layer; and forming an inorganic material layer over the silicon dioxide layer, wherein the inorganic material consists essentially of one of silicon nitride, silicon dioxide or $Si_xO_yN_z$, wherein x, y and z are each greater than 0.

5. The method of claim 4 wherein the imagable material is photoresist.

* * * * *